United States Patent
Sakamoto et al.

(10) Patent No.: US 6,717,368 B1
(45) Date of Patent: Apr. 6, 2004

(54) PLASMA GENERATOR USING MICROWAVE

(75) Inventors: Yuichi Sakamoto, Tokyo-to (JP); Kazuaki Senda, Niiza (JP)

(73) Assignee: Mikuro Denshi Corporation Limited, Niiza (JP)

( * ) Notice: Subject to any disclaimer, the term of this patent is extended or adjusted under 35 U.S.C. 154(b) by 0 days.

(21) Appl. No.: 10/241,992

(22) Filed: Sep. 12, 2002

(51) Int. Cl.[7] .............................. H01J 7/24; B23K 9/00
(52) U.S. Cl. .............................. 315/111.21; 315/111.71; 219/121.43; 219/121.36; 219/121.39; 219/121.4
(58) Field of Search ........................ 315/111.21, 111.11, 315/111.01, 111.91, 111.81, 111.71, 111.41; 219/121.36, 121.37, 121.39, 121.4, 121.42, 121.43, 121.11, 121.21

(56) References Cited

U.S. PATENT DOCUMENTS 5,529,632 A * 6/1996 Katayama et al. .... 118/732 MP
6,558,635 B2 * 5/2003 Minaee et al. .............. 422/186

* cited by examiner

Primary Examiner—Tuyet T. Vo
(74) Attorney, Agent, or Firm—Hogan & Hartson, LLP

(57) ABSTRACT

Here is disclosed a plasma generator using microwave wherein a plasma generating chamber is provided with a plurality of wave guide tubes extending in parallel one to another at regular intervals, each of the wave guide tubes being formed with a plurality of coupling ports arranged intermittently in an axial direction of the wave guide tube and dimensioned so that coupling coefficient thereof become gradually higher toward a distal end of the wave guide tube, and a plurality of dielectric windows provided through the plasma generating chamber in association with the respective coupling ports so that microwave electric power radiated through the coupling ports into the plasma generating chamber may be uniformized and thereby plasma of a large area may be generated with high and uniform density.

4 Claims, 8 Drawing Sheets

PRIOR ART

PRIOR ART

PLASMA GENERATOR USING MICROWAVE

BACKGROUND OF THE INVENTION

The present invention relates to a plasma generator using microwave and more particularly to such plasma generator used, for example, to wash or etch surface of a workpiece such as metallic piece, semiconductor or insulator or to coat the surface of such workpiece with thin film.

BACKGROUND ART

The plasma generator of RF (radio frequency power source) parallel-plate type as shown in FIG. 6 of the accompanying drawings has been most extensively used to generate processing plasma free from magnetic field.

This plasma generator 10 of well known art comprises a plasma generating chamber 11 containing therein a pair of conductive parallel plates 12a, 12b adapted to be power-supplied from a high-frequency power source 13 so that plasma 14 may be generated between the parallel plates 12a, 12b. Referring to FIG. 6, reference numeral 15 designates a vacuum pump and reference numeral 16 designates a gas charging line.

The plasma generator 20 of RF induction type as shown in FIG. 7 has been also extensively used.

This plasma generator 20 of well known art comprises a plasma generating chamber 21 provided therearound with a high frequency coil 22 adapted to be power-supplied from a high-frequency power source 23 so that plasma 24 may be generated within the plasma generating chamber 21.

Referring to FIG. 7, reference numeral 25 designates an auxiliary field coil, reference numeral 26 designates a vacuum pump and reference numeral 27 designates a gas charging line.

An example of the conventional plasma generators using microwave is the plasma generator of surface wave excitation type as shown in FIG. 8.

This plasma generator 30 of well known art comprises wave guide tubes 31, a plasma generating chamber 32 and a dielectric plates 33 interposed between the wave guide tubes 31 and the plasma generating chamber 32 so as to define dielectric windows. With such construction, the surface wave is generated on the surfaces of the dielectric plates 33 facing the plasma generating chamber 32 as power Po in the form of microwave is supplied from the wave guide tubes 31 and this surface wave ionizes gaseous molecules and thereby generates plasma 34.

Referring to FIG. 8, reference numeral 35 designates a vacuum pump and reference numeral 36 designates a gas charging line.

The plasma generator 10 of FIG. 6 is disadvantageous in that the plasma 14 has a diameter of 0.2 m or less, an electron density of $1 \times 10^{11}$ cm$^{-3}$ or less and a plasma density homogeneity of ±5% or less. As a result, both the plasma area and the electron density are too low to be used for surface processing of semiconductors and/or spray-coating with a thin film.

The plasma generator 20 of FIG. 7 is more advantageous than the plasma generator 10 so far as the electron density is concerned. However, it is impossible to obtain the plasma of homogeneous high electron density unless complicated adjustment is carried out by application of DC or high frequency auxiliary magnetic field by the auxiliary field coil 25.

The plasma generator 30 of FIG. 8 is necessarily accompanied with increased cost because a thickness of the dielectric plates 33 should be sufficiently increased to protect the plasma generating chamber 32 from ambient pressure if it is desired to enlarge the plasma area. Furthermore, it is difficult for this plasma generator 30 to ensure the desired homogeneity of the plasma density.

In view of the situation as has been described above, it is a principal object of the present invention to provide a plasma generator constructed so that the microwave energy may be used to improve the homogeneity of plasma density as well as the electron density and to ensure plasma having a large area.

SUMMARY OF THE INVENTION

The object set forth above is achieved, according to the present invention, by a plasma generator adapted to supply microwave energy into a plasma generating chamber to generate plasma within the plasma generating chamber, said plasma generator comprising a plurality of wave guide tubes arranged in parallel one to another to supply microwave energy, each of the wave guide tubes being formed with a plurality of coupling ports arranged intermittently in an axial direction of the wave guide tube and dimensioned so that coupling coefficient thereof become gradually higher toward a distal end of the wave guide tube, and a plurality of dielectric windows provided through the plasma generating chamber in association with the respective coupling ports of the wave guide tubes.

According to the present invention, the coupling ports are dimensioned so that these ports may have coupling coefficients gradually increasing toward the distal ends of the respective wave guide tubes and thereby microwave energy radiated through the respective coupling ports of the respective wave guide tubes may be uniformized.

Accordingly, by appropriately selecting the intervals of the plural wave guide tubes as well as the intervals of the coupling ports, plasma of high and uniform density can be generated by the microwave energy radiated through the coupling ports and the associated dielectric windows into the plasma generating chamber.

Area of the plasma generated in the manner as has been described above can be enlarged by providing the respective wave guide tubes with a plurality of the coupling ports.

The dielectric windows can be separated one from another in association with the respective coupling ports and therefore the size of the windows can be limited. This feature is advantageous also from the view point of the manufacturing cost.

The wave guide tubes are provided with a plurality of the coupling ports of circular or square shape and diameters of these circular or square ports formed through each of the wave guide tubes are gradually enlarged so as to have the coupling coefficient gradually increasing as closer to the distal end of the wave guide tube the coupling ports are.

The plasma generating chamber is formed at positions corresponding to the respective coupling ports of the respective wave guide tubes with openings communicating with the respective coupling ports so that these openings are blocked off by the dielectric plates and thereby the plasma generating chamber is sealed hermetically.

Furthermore, there are provided a plurality of wave guide tubes, each of these wave guide tubes being formed with a plurality of coupling ports adapted to uniformize the microwave energy radiated through these ports and thereby plasma of a large area is generated with high and uniform density.

The invention allows the dielectric windows to be separated one from another and the dielectric windows as thin as possible can be used. In consequence, the plasma generator using microwave can be easily implemented at a rational manufacturing cost.

DESCRIPTION OF THE PREFERRED EMBODIMENT

Details of the present invention will be more fully understood from the description of its typical embodiment given hereunder in reference with the accompanying drawings.

Figure 1:
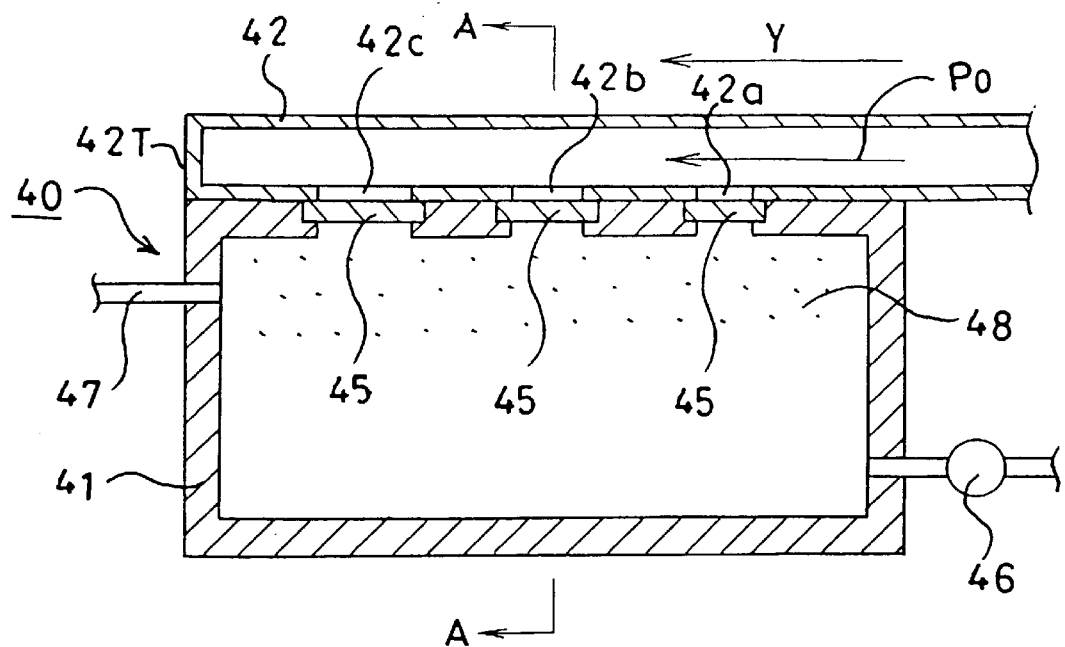
FIG. 1 is structural diagram schematically illustrating a typical embodiment of the plasma generator according to the invention.
Figure 2:
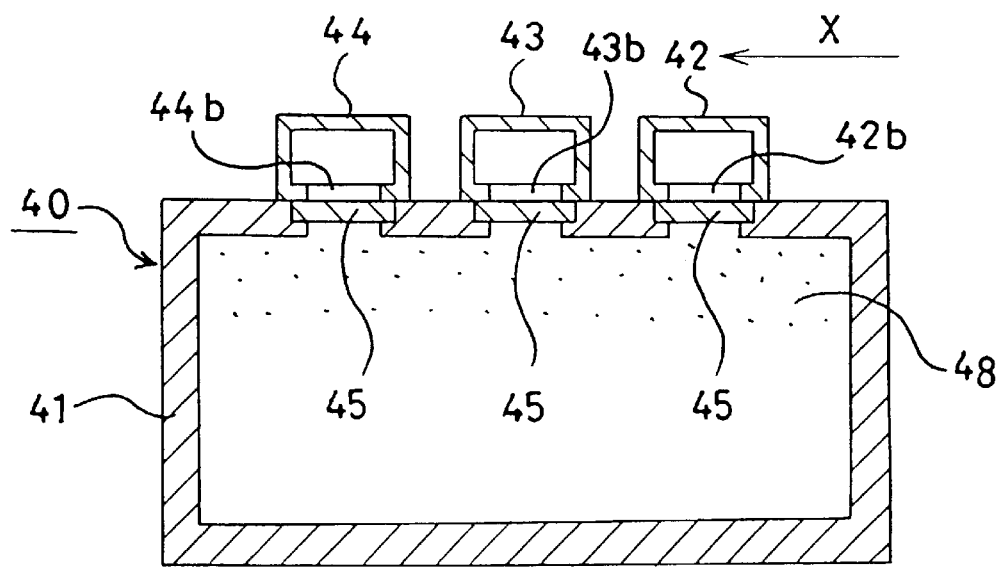
FIG. 2 is a structural diagram schematically illustrating this plasma generator in a section taken along a line A—A in FIG. 1.

FIG. 1 is a structural diagram schematically illustrating the plasma generator in a section taken along axis of one of the wave guide tubes and FIG. 2 is a structural diagram schematically illustrating this plasma generator in a section taken along a line A—A in FIG. 1.

For convenience of description, it is assumed in this embodiment that X-axis represents a direction in which the wave guide tubes are arranged in parallel one to another and Y-axis represents a direction in which axes of the respective wave guide tubes extend.

As illustrated, this plasma generator 40 comprises a plasma generating chamber 41, three wave guide tubes 42, 43, 44 arranged on upper surface of the plasma generating chamber 41 so as to extend in parallel one to another in the direction X, each of these wave guide tubes 42, 43, 44 being provided with three coupling ports arranged in a direction of the tube axis (i.e., in the direction Y).

The coupling ports are circular radiation ports adapted to radiate microwave electric power Po into the plasma generating chamber 41 and, as will be seen in FIG. 1, each of the wave guide tubes, for example, the wave guide tube 42 is formed with three coupling ports 42a, 42b, 42c arranged in the axial direction of this wave guide tube 42.

These coupling ports 42a, 42b, 42c respectively have diameters gradually enlarged from a supply side of the microwave electric power Po toward a distal end 42T of the wave guide tube 42 so that a coupling coefficient to the microwave electric power Po may gradually increase.

Such arrangement is in view of the fact that the microwave electric power Po entering from a power source into the wave guide tube 42 gradually decreases toward the distal end 42T of the wave guide tube 42.

While FIG. 1 merely illustrates the wave guide tube 42 and its coupling ports 42a, 42b, 42c, it will be obviously understood that the wave guide tube 43 is provided with coupling ports 43a, 43b, 43c (coupling ports 43a and 43c are not shown in FIG. 2) and the wave guide tube 44 is provided with coupling ports 44a, 44b, 44c (coupling ports 44a and 44c are not shown in FIG. 2).

The plasma generating chamber 41 is formed through its upper wall with circular ports communicating with the coupling ports, respectively, and these circular ports of the plasma generating chamber 41 are blocked off by dielectric plates (e.g., plates of quartz or alumina) having peripheral edges thereof tightly engaged with peripheral edges of the associated ports to form dielectric windows 45 adapted to block the plasma generating chamber 41 off from outside air.

These dielectric windows 45 are preferably as thin as possible so far as these windows 45 can resist the ambient pressure.

Referring to FIG. 1, reference numeral 46 designates a vacuum pump and reference numeral 47 designates a gas charging line.

Figure 3:
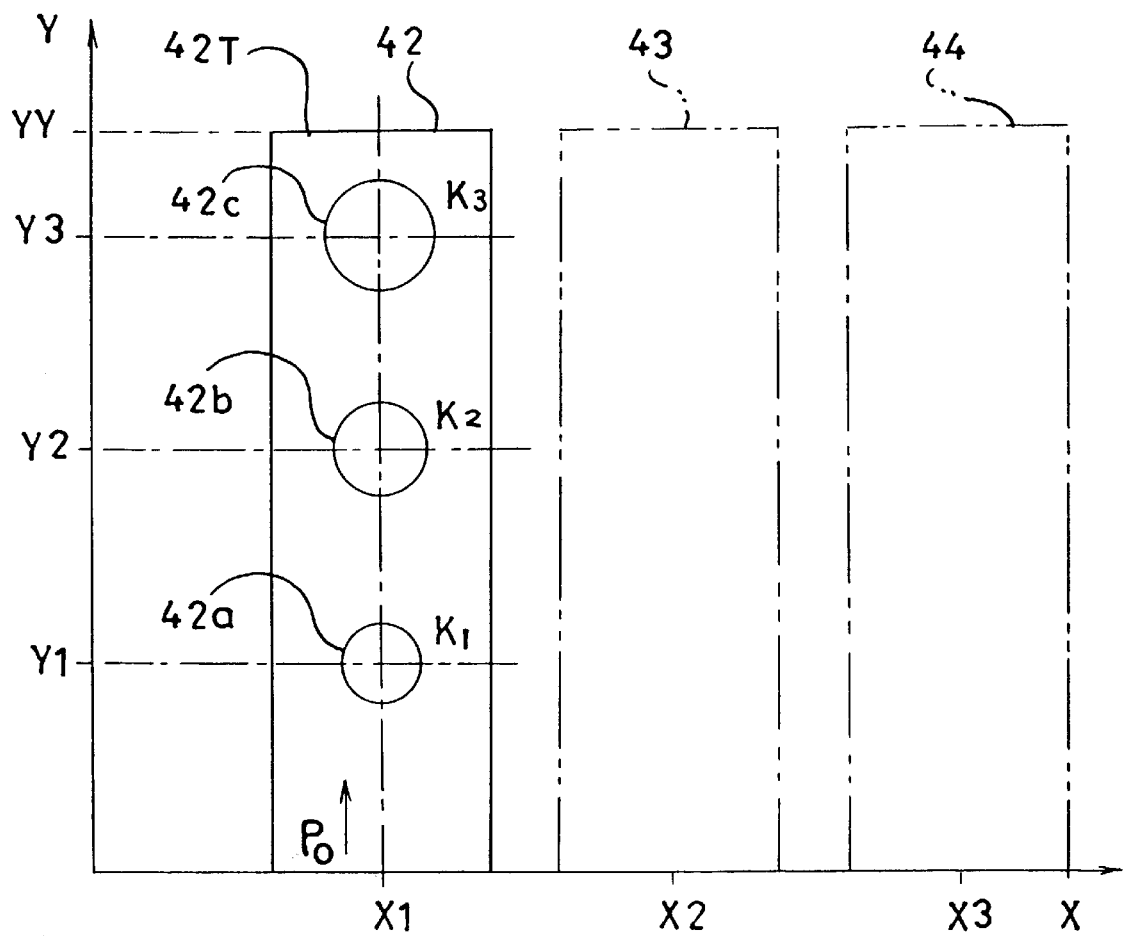
FIG. 3 is a diagram illustrating placement and function of wave guide tubes constituting the plasma generator and of coupling ports of these wave guide tubes.

FIG. 3 is a diagram illustrating placement of the coupling ports as have been described above.

While the placement of these coupling ports is illustrated with respect only to the wave guide tube 42, it should be understood that such placement is true also with respect to the other wave guide tubes 43, 44.

In FIG. 3, X1 designates a position at which a longitudinal axis of the wave guide tube 42 extends, Y1, Y2, Y3 respectively designate positions at which this wave guide tube 42 is formed with the coupling ports 42a, 42b and 42c, and YY designates a short-circuit plate defining the distal end of this wave guide tube 42.

A dimension by which the coupling ports 42a, 42b are spaced from each other is set to Y2−Y1=(2n+1)·λg/2, a dimension by which the coupling ports 42b, 42c are spaced from each other is set to Y3−Y2=(2n+1)·λg/2 and a dimension by which the coupling port 42c and the short-circuit plate YY are spaced from each other is set to YY−Y3=λg/4.

In these equations, λg represents a wave length within the tube and n represents integer.

With the coupling ports 42a, 42b, 42c arranged as has been described above, the microwave is radiated through these coupling ports and the associated dielectric windows 45 into the plasma generating chamber 41 in a manner as will be described on the assumption that the microwave electric power Po is supplied from the side adjacent the coupling port 42a and the coupling ports 42a, 42b, 42c respective have coupling coefficients $K_1$, $K_2$, $K_3$.

The coupling coefficients depend on the sizes of the respective coupling ports and therefore $K_1 < K_2 < K_3$.

More specifically, the microwave electric power (free-traveling wave electric power plus reflective wave electric power) is radiated through the respective coupling ports 42a, 42b, 42c and the associated dielectric windows 45 in a manner as follows:

through the coupling port 42a:

$$Po \cdot K_1[1+(1-K_1)(1-K_2)^2(1-K_3)^2] \qquad (1)$$

through the coupling port 42b:

$$Po \cdot K_2(1-K_1)[1+(1-K_2)(1-K_3)^2] \qquad (2)$$

through the coupling port 42c:

$$Po \cdot K_3(1-K_1)(1-K_2)[1+(1-K_3)] \qquad (3)$$

The wave reflected on the short-circuit plate YY is phase-shifted from the free-traveling wave by 180° and, in consequence, the free-traveling wave and the reflective wave are in phase at the respective coupling ports. That is, these different types of wave electric power are combined with each other and radiated through the respective coupling ports into the plasma generating chamber 41.

The reflective wave is expressed by:

$$Po(1-K_1)^2(1-K_2)^2(1-K_3)^2 \qquad (4)$$

In order that the microwave electric power Po can be radiated through the respective coupling ports 42a, 42b, 42c into the plasma generating chamber as equally as possible, the coupling coefficients of the respective coupling ports may be set, for example, to $K_1=0.3$, $K_2=0.4$ and $K_3=0.5$. In this case, the equations (1)–(4) will result in:

through the coupling port 42a: 0.32Po through the coupling port 42b: 0.32Po through the coupling port 42c: 0.32Po by reflection: 0.04Po.

In this way, the microwave electric power Po is absorbed in the vicinity of the respective coupling ports and equally radiated through the respective coupling ports into the plasma generating chamber 41 so that the plasma 48 may be homogenously generated within the plasma generating chamber 41.

The microwave interacts with electrons in the plasma generated in this manner to be subjected to Landau damping and the energy due to this Landau damping is consumed for acceleration of the electrons and contributes to ionization of gaseous molecules.

The Landau damping effect is proportionately higher as higher the density of the electrons is.

The plasma 48 generated within the plasma generating chamber 41 spreads by diffusion.

Diffusion is a statistical phenomenon and dependence of the density on a range of diffusion results in Gauss distribution. In other words, the plasma generated in the vicinity of the coupling ports 42a, 42b, 42c present independent Gauss distributions, respectively.

The density of the electrons in the plasma in the vicinity of the respective dielectric windows is proportionately higher as thinner the dielectric windows 45 are. The microwave is thus rapidly attenuated in the vicinity of the windows and consequently the plasma of higher density is generated in the vicinity of the windows. In this way, electromagnetic interference among a plurality of windows is eliminated, making it possible to propagate the microwave substantially free from reflection.

In view of this, it is possible to make the respective Gauss distributions of plasma overlap one another and thereby to ensure the plasma 48 of a uniform density distribution by appropriately selecting the distance between each pair of the adjacent wave guide tubes 42, 43, 44 and the number as well as the intervals of the coupling ports.

Figure 3A:
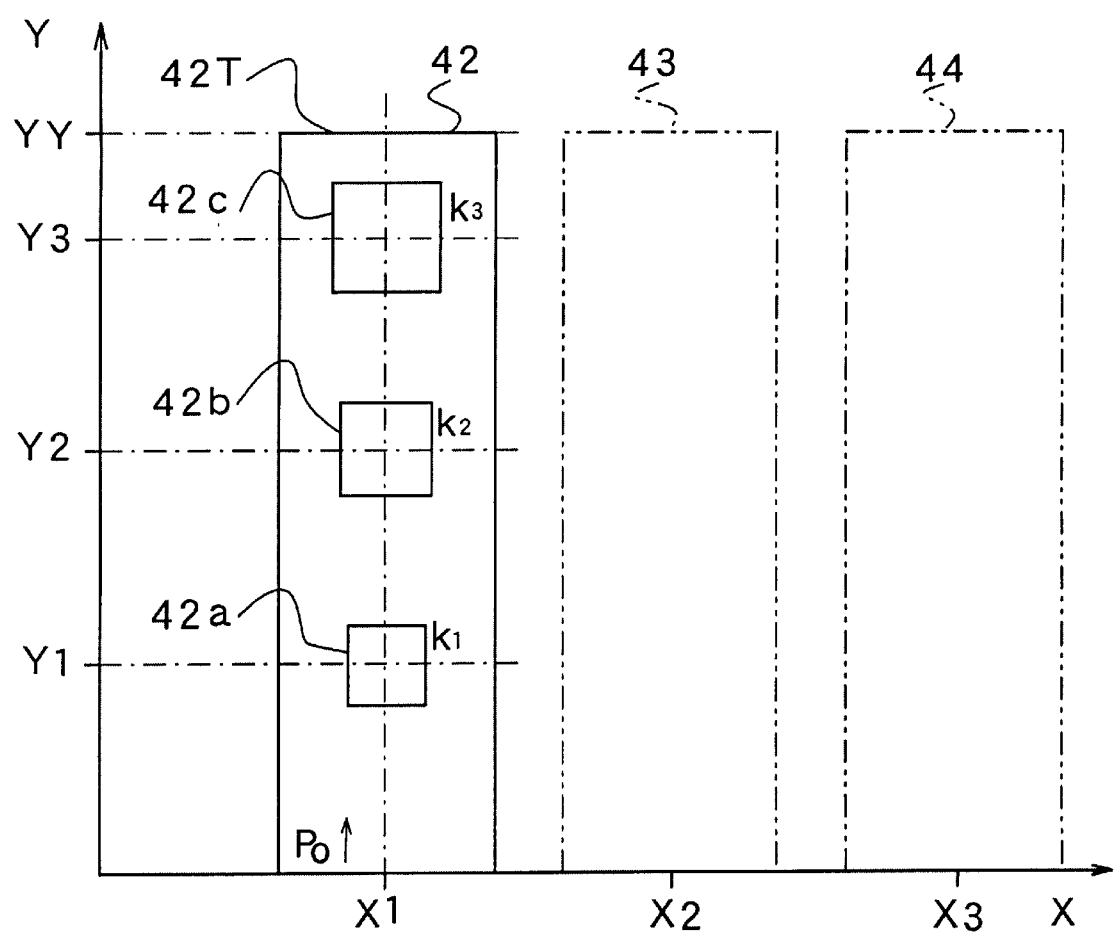
FIG. 3A is a diagram illustrating placement and function of wave guide tubes having square coupling ports.

FIG. 3A is a diagram illustrating an embodiment generally similar to that shown in FIG. 3, but with square coupling ports 42a, 42b, 42c.

Figure 4:
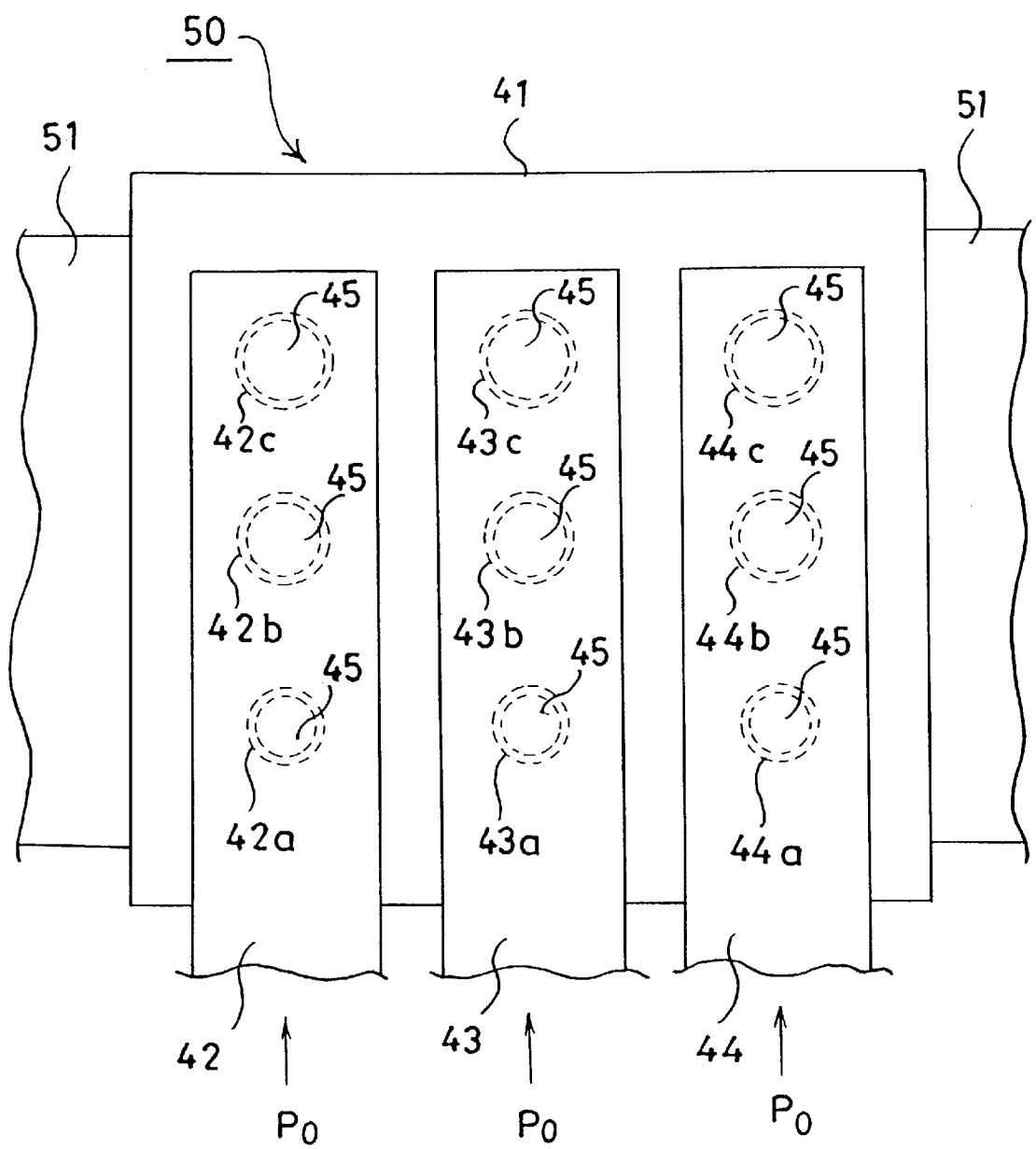
FIG. 4 is a fragmentary diagram illustrating the plasma generator.

FIG. 4 is a diagram illustrating a specific example of the plasma generator 40.

Figure 4A:
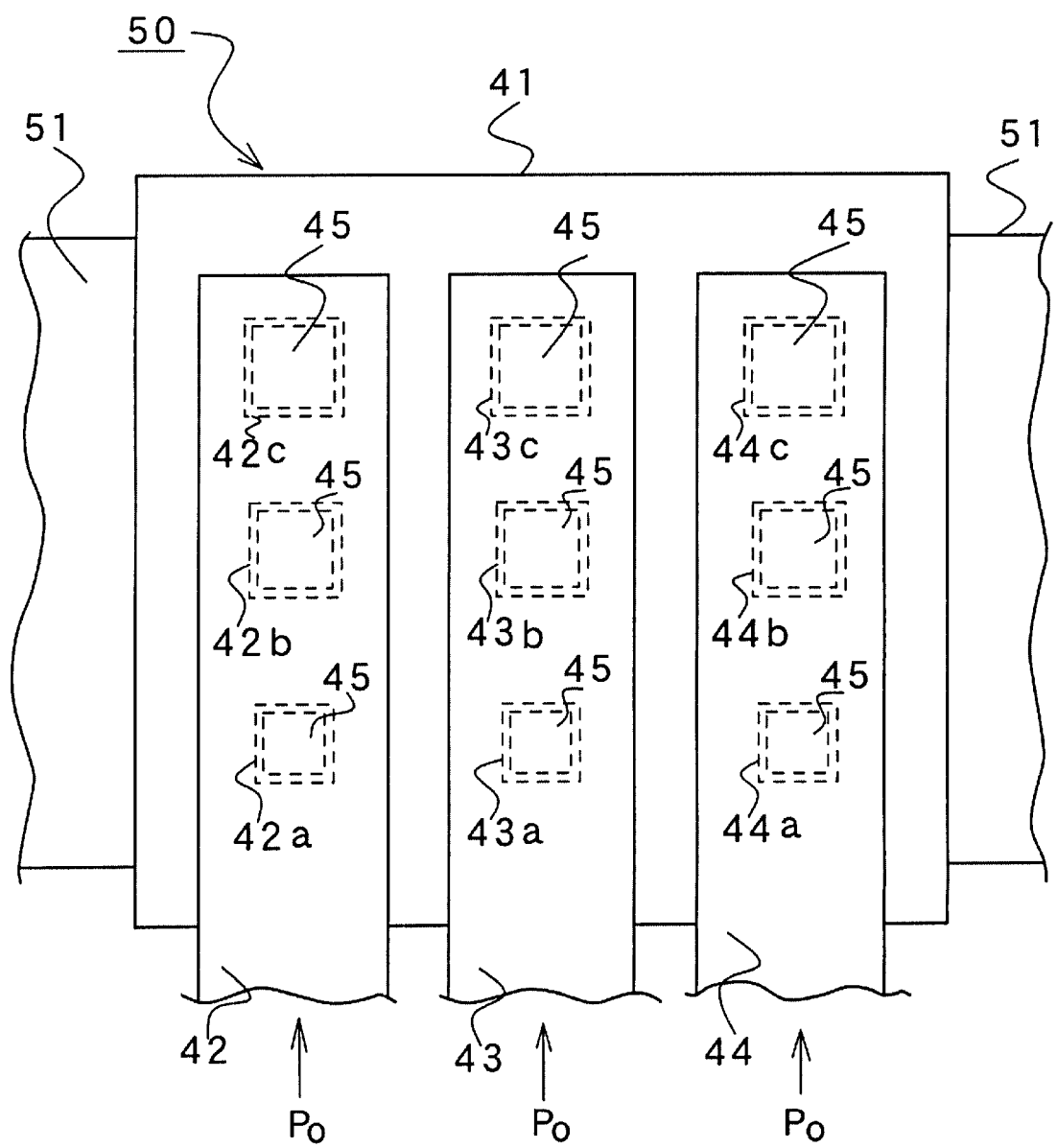
FIG. 4A is a fragmentary diagram illustrating a plasma generator with square coupling ports.

FIG. 4A is a diagram illustrating a specific example of a plasma generator 50 that is generally similar to the plasma generator of FIG. 4, but with square coupling ports.

Figure 5:
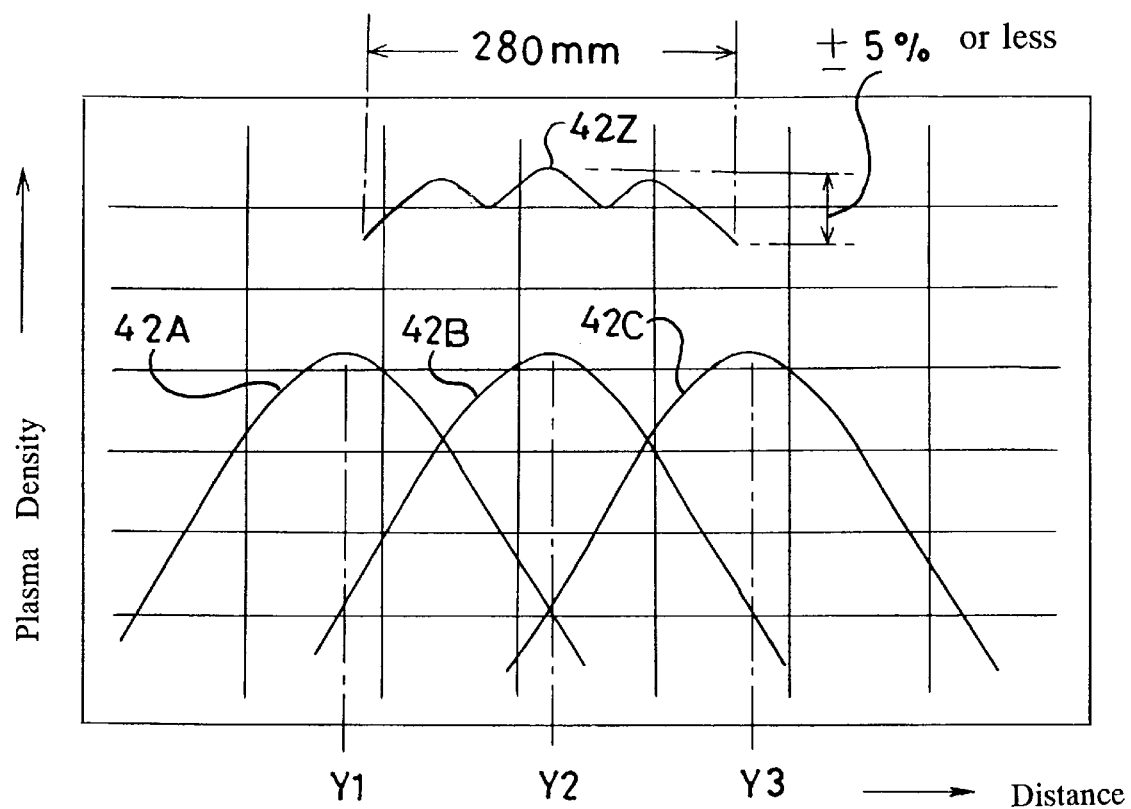
FIG. 5 is a graphic diagram plotting plasma characteristics based on a result of experiments conducted on this embodiment.
Figure 6:
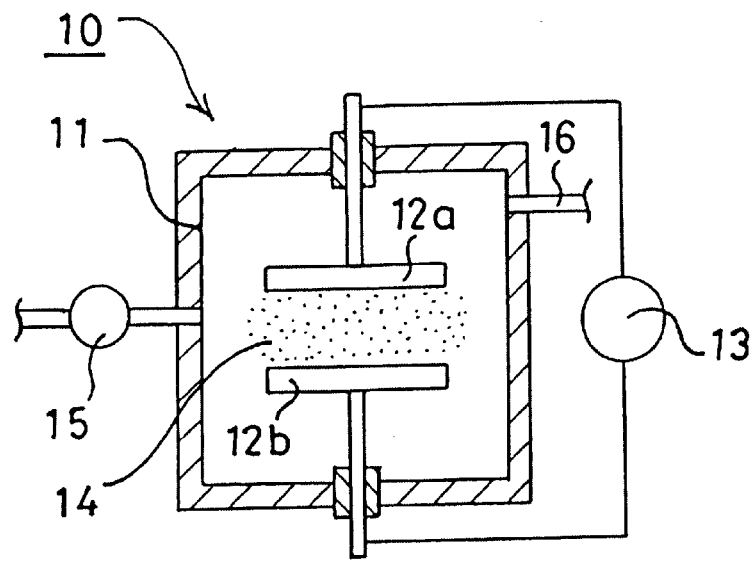
FIG. 6 is a diagram schematically illustrating a RF parallel-plate type plasma generator of prior art.
Figure 7:
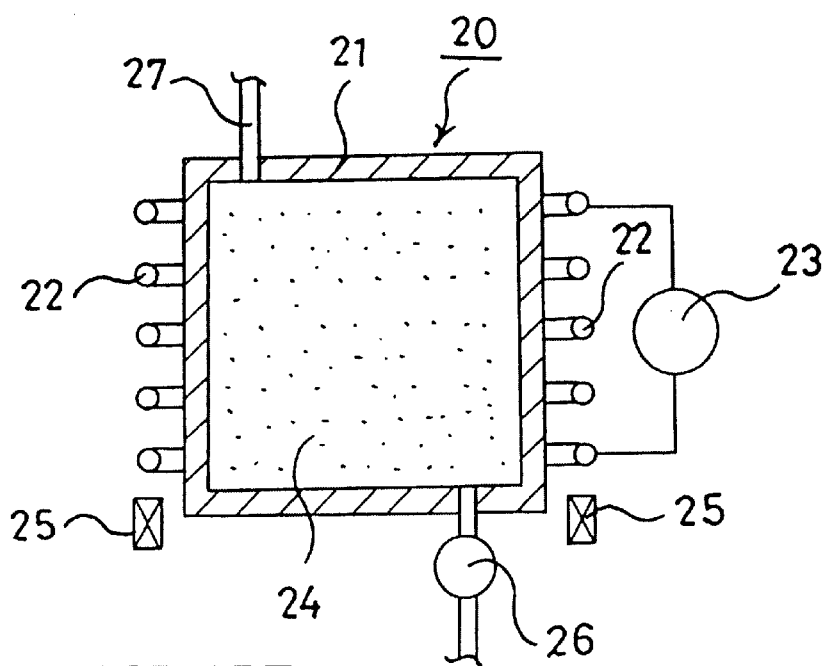
FIG. 7 is a diagram schematically illustrating a RF induction type plasma generator of prior art.
Figure 8:
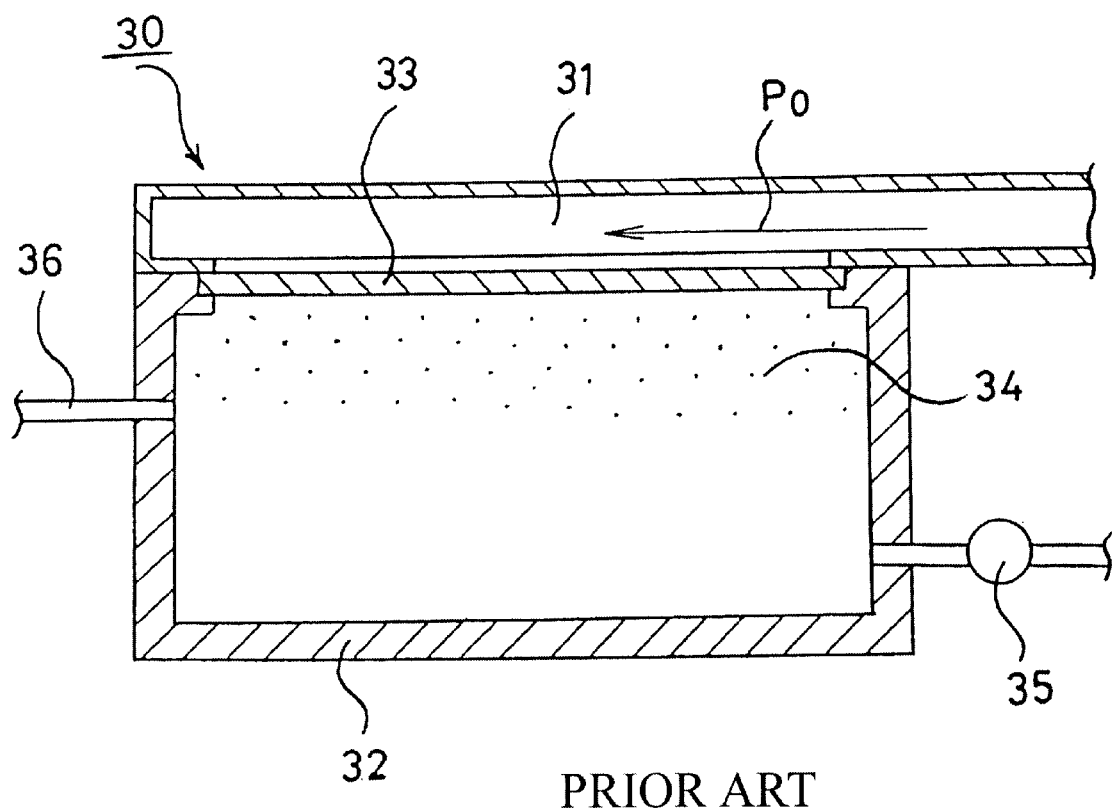
FIG. 8 is a diagram schematically illustrating a plasma generator of prior art using microwave.

FIG. 5 is a graphic diagram plotting plasma characteristics based on a result of experiments conducted on the embodiment 50 illustrated in FIG. 4.

Referring to FIG. 5, a characteristic curve 42A indicates Gaussian plasma characteristic associated with the coupling port 42a, a characteristic curve 42B indicates Gaussian plasma characteristic associated with the coupling port 42b and a characteristic curve 42c indicates Gaussian plasma characteristic associated with the coupling port 42c.

It has been found from the experiment that each plasma 42A, 42B, 42C achieves the plasma density homogeneity with deviation of ±5% or less over a width of 70 mm.

A characteristic curve 42Z indicates a composite characteristic of those exhibited by the plasma 42A, 42B and 42C. According to this composite characteristic, combination of the plasma 42A, 42B and 42C enables the homogeneity of plasma density to be ensured with deviation of ±5% or less over a width of 280 mm.

With this plasma generator 50, placement of the wave guide tubes 42, 43, 44 have been optimized and it has been found that the plasma having a large area of 0.3 m×0.3 m, an electron density of $1\times10^{12}$ cm$^{-3}$ and a homogeneity with deviation of ±5% or less can be generated.

While the plasma generator 50 is provided with the rectangular plasma generating chamber 41 taking account of the fact that the workpiece is often rectangular and of relatively large area, the plasma generating chamber 41 may be of any shape other than the rectangular shape.

Obviously, it is essential not only to reinforce the plasma generating chamber 41 and thereby to prevent the plasma generating chamber 41 from being collapsed by ambient pressure but also to provide on one or both of the side walls of the plasma generating chamber 41 with load lock or locks 51 if continuous processing is intended.

In the plasma generator as has been described above, gas such as $Cl_2$ or $F_2$ is charged through the gas charging line 47 for etching process and gas such as $CH_4$ or $C_2H_6$ is charged through the gas charging line 47 for thin film coating process.

As will be apparent from the foregoing description of the embodiment and the specific example thereof, it is unnecessary to make the dielectric windows 45 continuous one to another. In other words, it is possible to separate these windows 45 one from another so as to correspond to the associated coupling ports. In this way, a relatively thin dielectric plate can be used to define each of the windows.

This is an important feature from the viewpoint of the manufacturing cost.

Without departing the scope of the invention, the number as well as the intervals of the wave guide tubes and the number as well as the intervals of the coupling ports formed through the respective wave guide tubes can be appropriately selected. Furthermore, the shape of the coupling ports is not to circular shape and may be square to achieve the same effect.

What is claimed is:

1. A plasma generator adapted to supply microwave energy into a plasma generating chamber to generate plasma within the plasma generating chamber, said plasma generator comprising:

a plurality of wave guide tubes arranged in parallel one to another to supply microwave energy, each of the wave guide tubes being formed with a plurality of coupling ports arranged intermittently in an axial direction of the wave guide tube and dimensioned so that coupling coefficients thereof become gradually higher toward a distal end of the wave guide tube; and a plurality of dielectric windows provided through the plasma generating chamber in association with the respective coupling ports of the wave guide tubes.

2. The plasma generator according to claim 1, wherein the plasma generating chamber is provided with a plurality of the wave guide tubes extending in parallel one to another and spaced one from another, and formed at positions corresponding to the respective coupling ports of the respective wave guide tubes with openings communicating with the respective coupling ports so that these openings are blocked off by the dielectric plates and thereby the plasma generating chamber is sealed hermetically.

3. The plasma generator according to claim 1, wherein each of the wave guide tubes is provided with a plurality of the coupling ports of circular or square shape.

4. The plasma generator according to claim 3, wherein diameters of the circular or widths of the square ports formed through each of the wave guide tubes are gradually enlarged so as to have the coupling coefficient gradually increasing in a direction toward the distal end of the tube.

* * * * *